United States Patent [19]

Taylor et al.

[11] Patent Number: 5,161,984
[45] Date of Patent: Nov. 10, 1992

[54] ELECTRICAL SOCKET

[75] Inventors: Attalee S. Taylor, Palmyra; Robert D. Park, Camp Hill, both of Pa.

[73] Assignee: AMP Incorporated, Harrisburg, Pa.

[21] Appl. No.: 778,296

[22] Filed: Oct. 16, 1991

[51] Int. Cl.$^5$ ............................................. H01R 13/00
[52] U.S. Cl. ........................................................ 439/73
[58] Field of Search ................................... 439/68–73, 439/330, 493

[56] References Cited

U.S. PATENT DOCUMENTS

| | | | |
|---|---|---|---|
| 3,335,327 | 8/1967 | Damon et al. | 439/72 |
| 4,783,719 | 11/1989 | Jamison et al. | 361/398 |
| 4,859,189 | 8/1989 | Petersen et al. | 439/66 |
| 4,969,828 | 11/1990 | Bright et al. | 439/73 |

FOREIGN PATENT DOCUMENTS 20693  1/1989  Japan ...................................... 439/72

Primary Examiner—Joseph H. McGlynn

[57] ABSTRACT

An electrical socket (40) for burn-in/tests of PQFP devices (38) is disclosed. The socket (40) includes a base (42) on which a flexible etched circuit member (46) is placed and pressure members (44) pivotally attached to the base (42) with fingers (82) biased against contact pads (112) on conductive traces (98). The device (38) is located on the base (42) with leads (14) pressed against the contact pads (112) by the fingers (82) for electrical engagement therebetween.

12 Claims, 10 Drawing Sheets

ELECTRICAL SOCKET

FIELD OF THE INVENTION

The invention disclosed herein relates to electrical sockets for burn-in and other tests on fine line plastic quad flat pack devices.

BACKGROUND OF THE INVENTION

The leads on electronic devices such as the PQFP (plastic quad flat pack) device are critical components of the device and must be defect-free when delivered to the customer. Often times however, the leads may be marred or nicked from testing and hence unacceptable. To avoid this problem, testing may occur at the distal ends of the leads which are then removed prior to the final lead-forming. Accordingly it is now proposed to provide a socket to be used in testing and burn-in of PQFPs prior to the final manufacturing stage.

SUMMARY OF THE INVENTION

According to the invention, a burn-in/test socket for electronic devices having leads extending outwardly therefrom is provided. The socket includes a base with a central area for receiving the device and a recessed area over which the leads extend. A flexible etched circuit member is placed on the base with contact pads on one end of conductive traces being supported in the recessed area. The other ends of the traces are terminated to a PCB. Pressure members on the base apply a normal force between the leads and contact pads to establish an electrical engagement therebetween.

DESCRIPTION OF THE INVENTION

Figure 1:
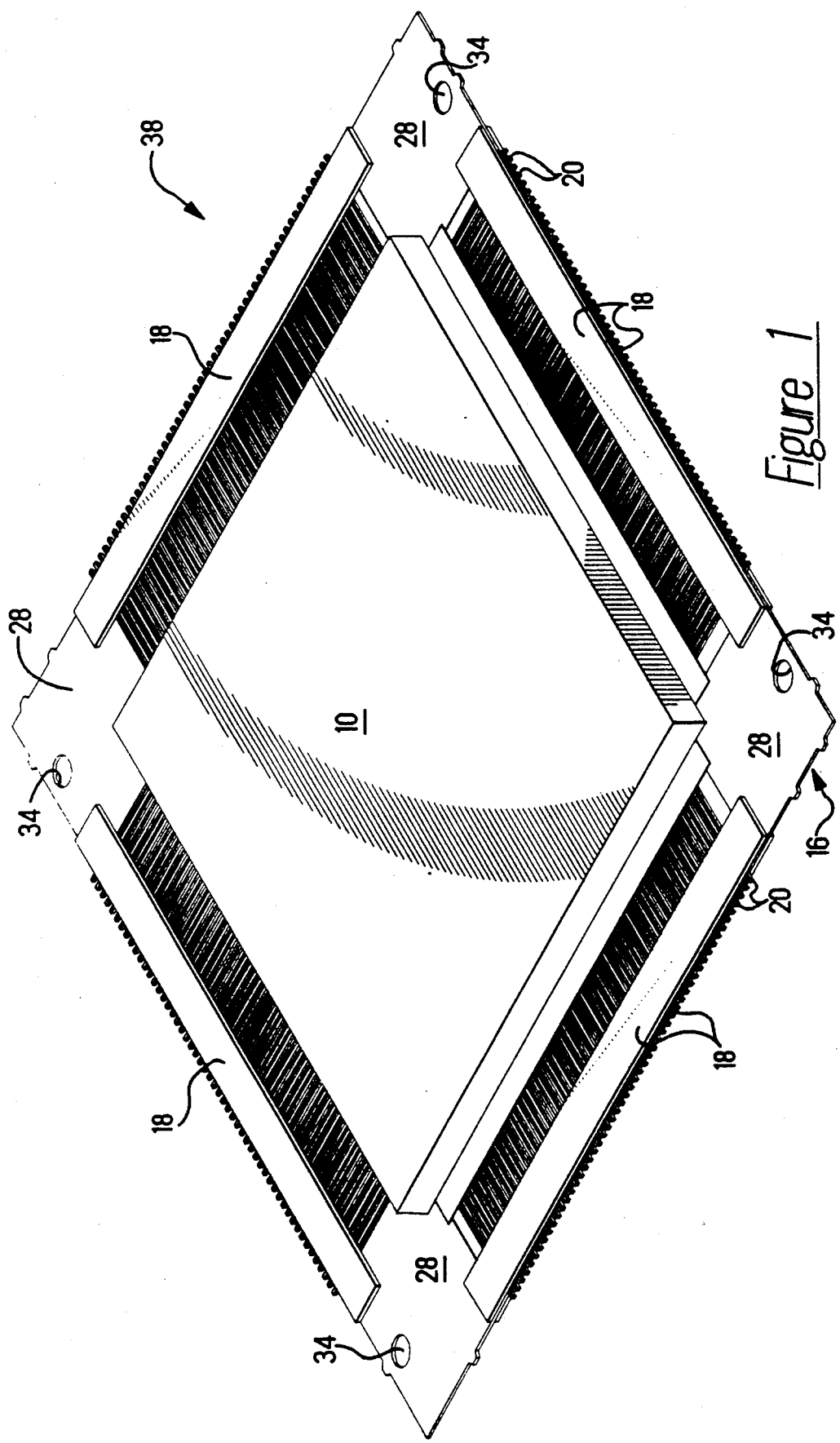
FIG. 1 is an isometric view of a PQFP in a flat form for testing.
Figure 2:
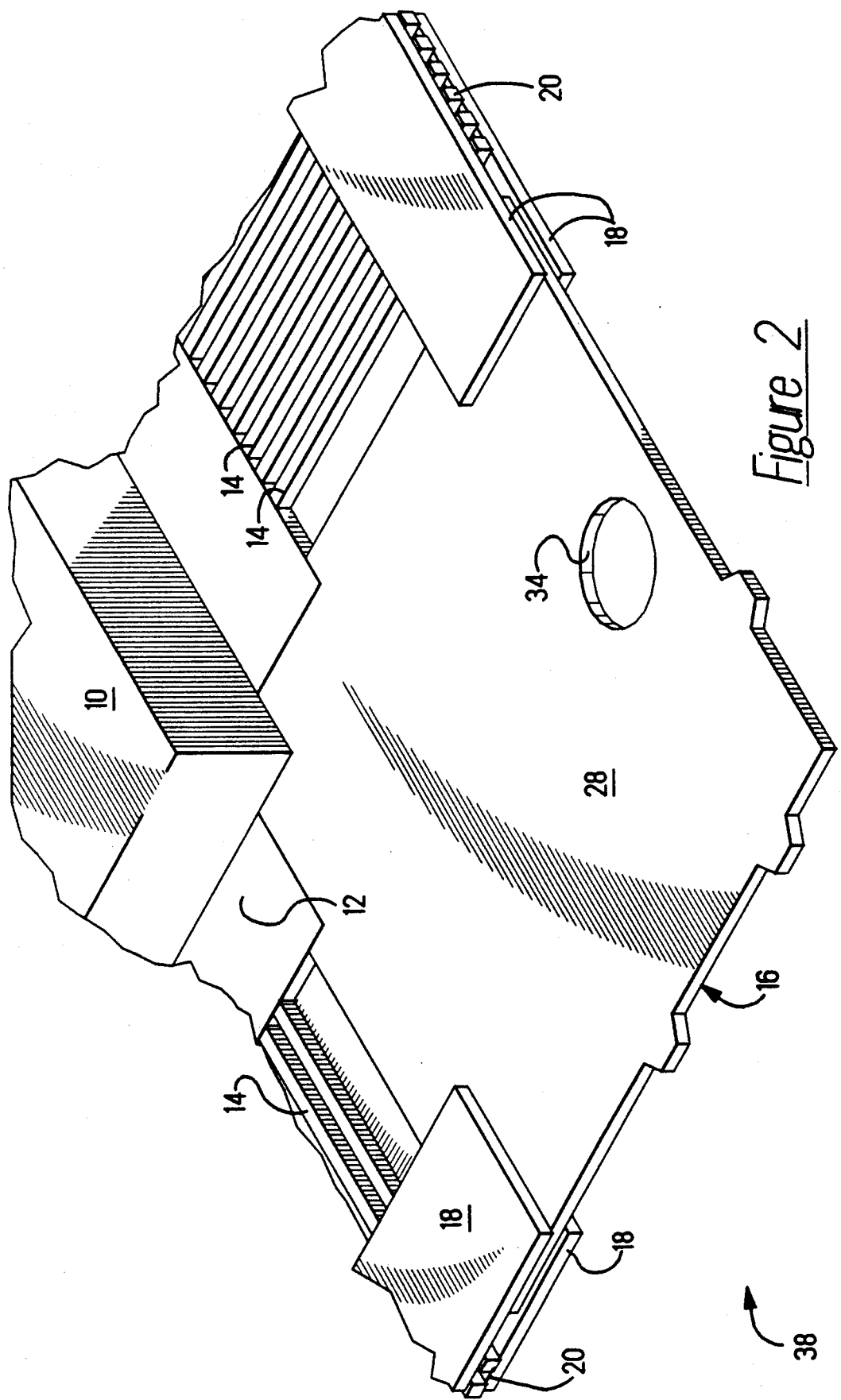
FIG. 2 is a detailed isometric view of one corner of the PQFP shown in FIG. 1.

Before providing a description of the socket of the present invention, an understanding of the electronic device to be tested in the socket will be helpful. The device, flat pack 10, is shown in FIGS. 1 and 2 to which reference will now be made.

Flat pack 10 includes body 12 from which leads 14 extend. As shown, leads 14 have not been formed into the final gull-wing shape but are flat.

Flat pack 10 is carried on lead frame 16 from which leads 14 were originally formed. Prior to excising the outer frame material (not shown), layers 18 are laid along the end areas 20 of leads 14 on both sides to provide and electrically isolate the leads.

Three corner areas 28 are provided with alignment holes 34.

Flat pack 10, frame 16 and layers 18 form test device 38.

Figure 3:
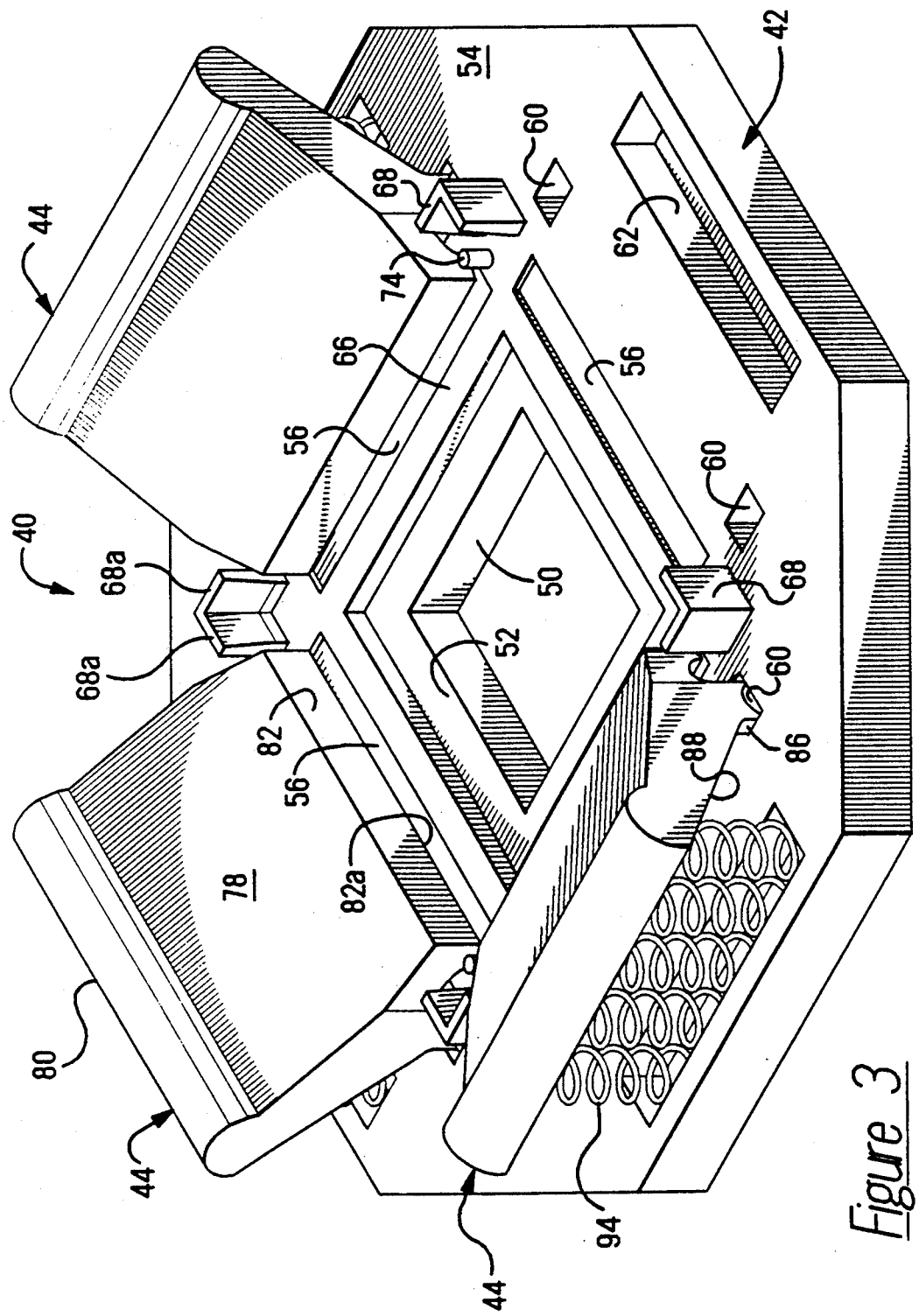
FIG. 3 is an isometric view of a socket in accordance with the present invention.

Socket 40 of the present invention is shown in FIG. 3. The major components include base 42, four pressure members 44 (only three are shown) and FEC (flexible etched circuit) member 46 (shown in FIG. 4).

Opening 50 is in the center of and extends through base 42. Recess 52 in top surface 54 surrounds opening 50.

Outwardly from and located beneath a portion of each pressure member 44 are grooves 56.

Pairs of spaced apart apertures 60 are located outwardly from grooves 56 and further out are grooves 62.

A central area 66 is defined by grooves 56 and lead-in members 68 located at each of four corners of the area. Lead-in members 68 include two walls 68a at right angles to each other. A keying member 72 is located in one corner near a lead-in member 68 and alignment pegs 74 are located in the other three corners.

Each pressure member 44 includes body section 78 having a curved end surface 80 and at another end a finger 82. A pair of hinge stubs 86 project outwardly from under surface 88 and are located at each side of section 78. Stubs 86 are at an angle of about forty-five degrees relative to section 78 so that, when pressure members are hinged to base 42 and are in a normally closed position, body section 78 is at an oblique angle to base 42 with curved surface 80 being remote therefrom and finger 82 being in groove 56. Further, finger 82 is at an angle of about forty-five degrees so that free end surface 82a is parallel to top surface 54.

Fingers 82 may be split periodically to provide some relative motion of about 0.001–0.002 inches. This makes up for coplanarity differences in the device leads and/or the FEC.

Aperture 92 (FIG. 5) in body section 78 near curved end surface 80 opens out on under surface 88.

Pressure members 44 are pivotally attached to base 42 by stubs 86 being hingedly attached within the aforementioned pairs of apertures 60 in top surface 54. Stainless steel coil springs 94, with one end in grooves 62 and another end in apertures 92, bias pressure members 44 in the closed position shown in FIGS. 3 and 5.

Figure 4:
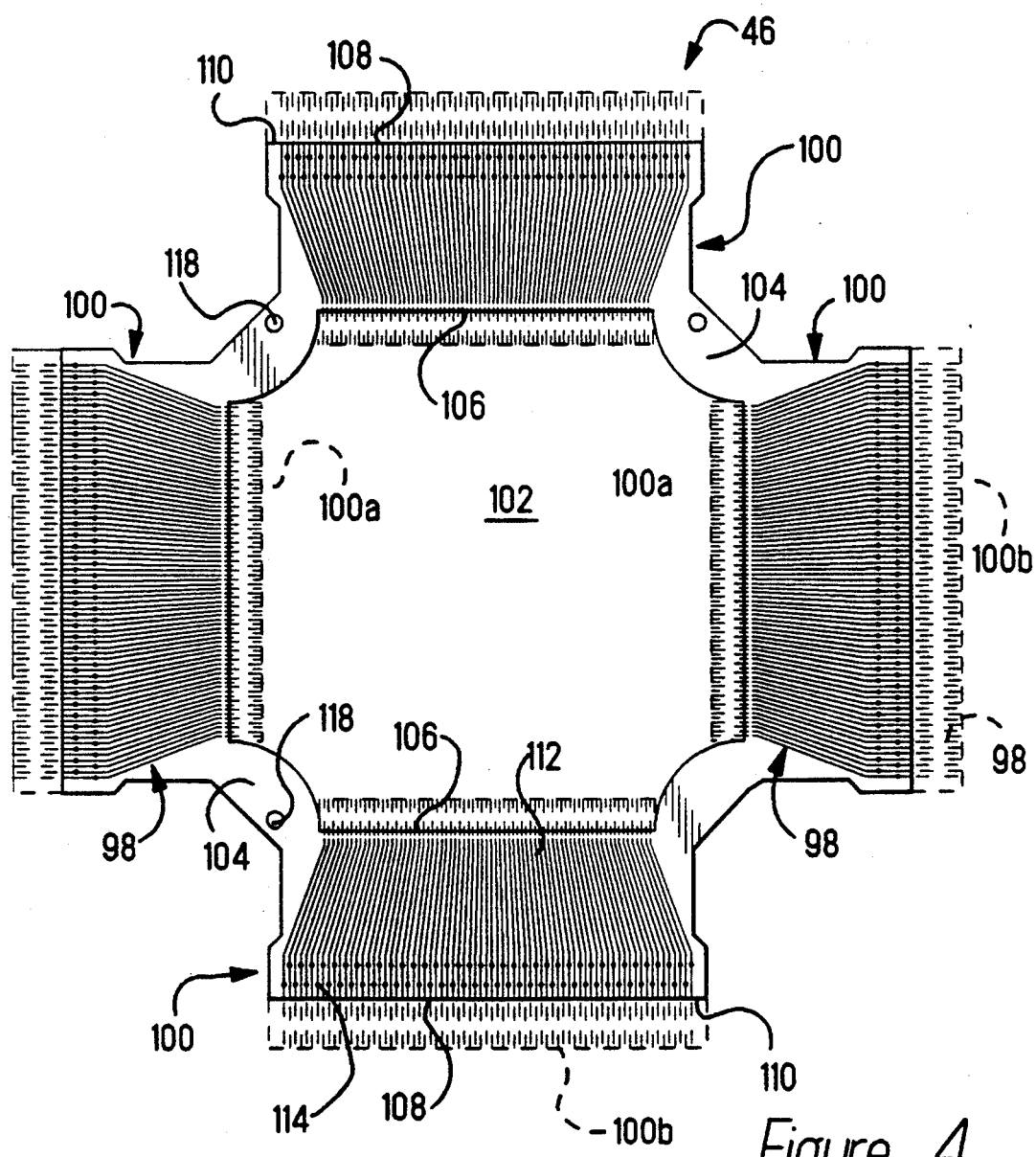
FIG. 4 is a top plan view of a flexible etched circuitry conductive member used in the socket.

FEC member 46 is shown in FIG. 4. The film is commercially available from various manufacturers and generally have conductive traces on a dielectric substrate such as a polyester film sold under the trade name KAPTON by the DuPont Company.

FEC member 46 includes conductive traces 98 on flaps 100 which are on each side of a large central opening 102. Narrow straps 104 extend between and connect adjacent flaps 100.

Conductive traces 98 include inner ends 106 adjacent to opening 102 and outer ends 108 adjacent to free ends 110. Preferably a raised contact bump or pad 112 is provided on each trace at the inner ends 106. The raised pads 112 are shown more clearly in subsequent drawings. Holes 114 are provided on traces 98 near outer ends 108. Due to the density, holes 114 are staggered to facilitate the termination of traces 98 as will be discussed below.

Alignment holes 118 are provided on three straps 104 and slot 120 is provided on the fourth strap 104. FEC member 46 shown in FIG. 4 is for use with socket 40 shown in FIGS. 5 and 6. Another embodiment, FEC member 46a, shown on the socket 40a in FIGS. 7 and 8, differ in that flaps 100 are provided with extensions 100a (shown in FIG. 8) which extend into openings 102 and on which are provided a continuation of traces 98 with contact pads 112 located at the ends thereof on the extension but on the reverse side.

Figure 9:
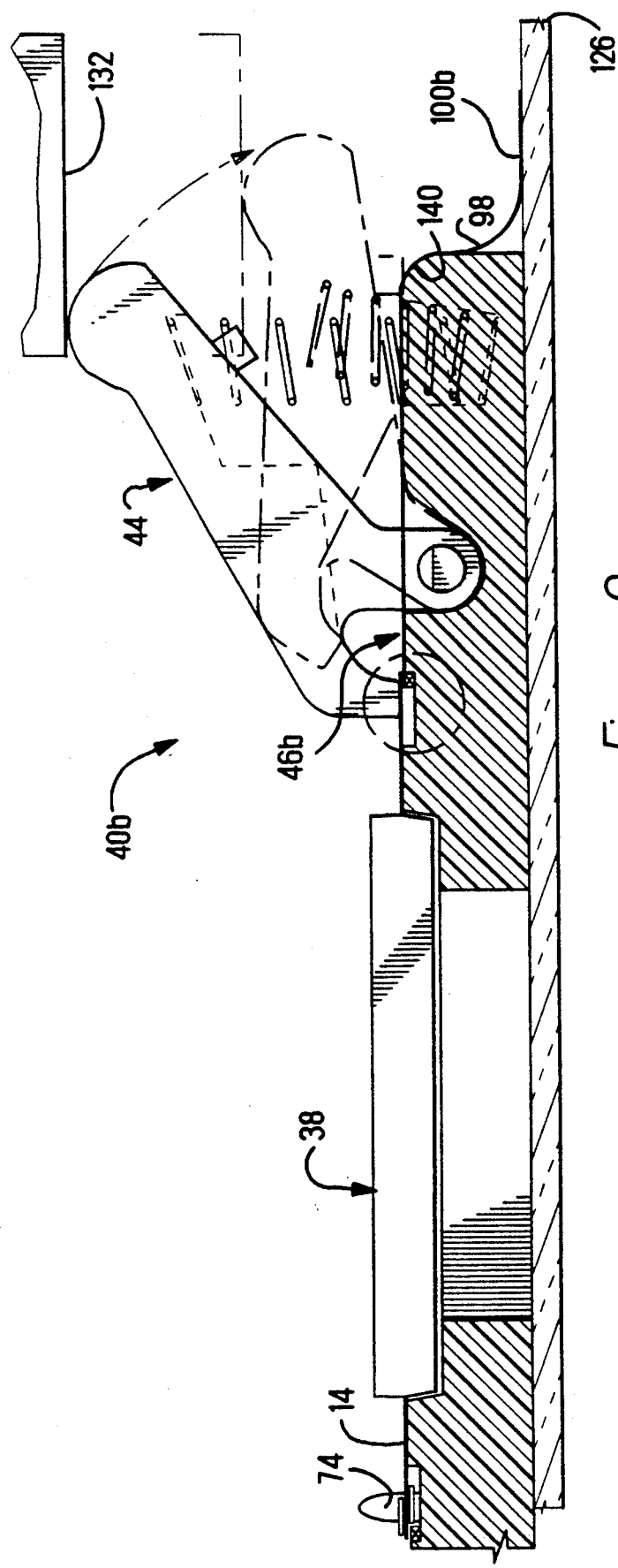
FIG. 9 is a side, sectioned view of yet another embodiment of the socket.
Figure 10:
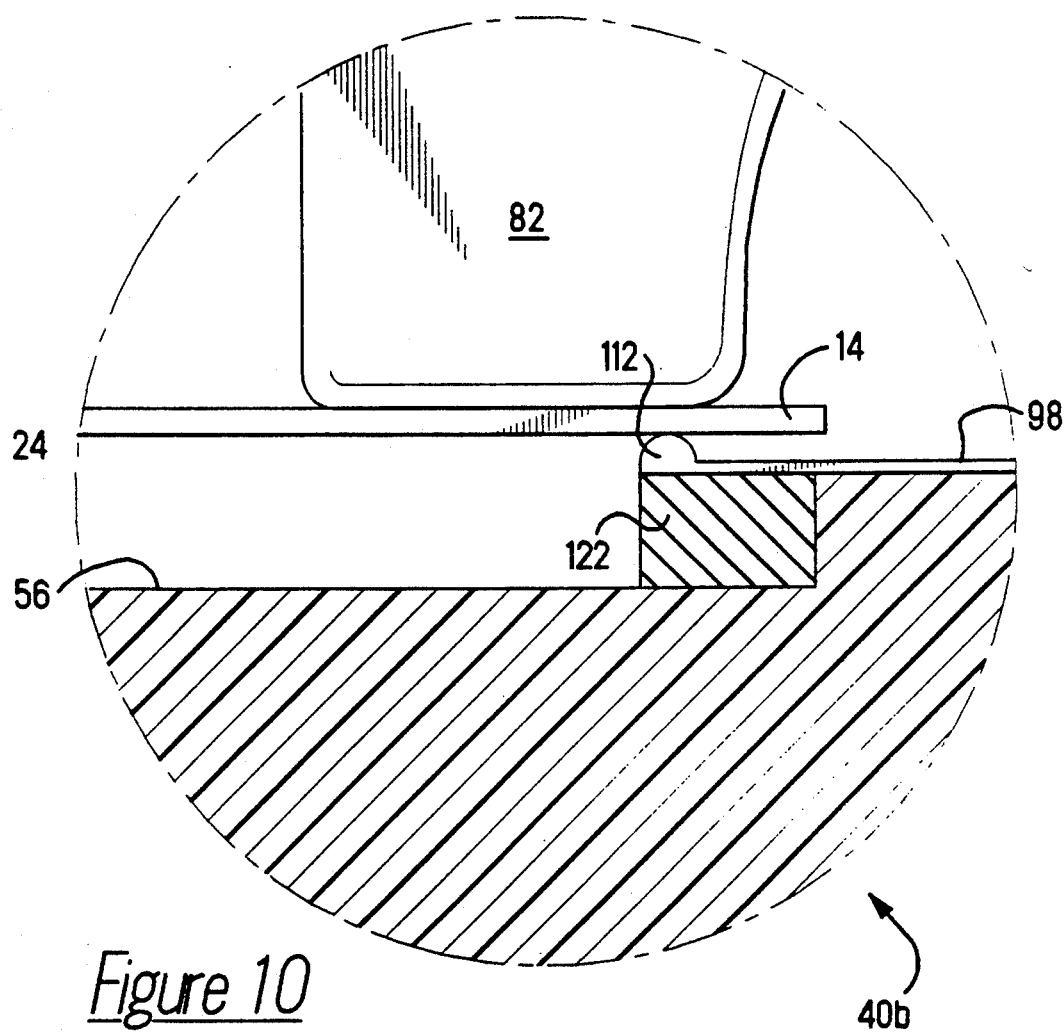
FIG. 10 is an enlarged view of a portion of the socket shown in FIG. 9.

A third embodiment, FEC member 46b, shown on socket 40b in FIGS. 9 and 10, differ in that flaps 100 are provided extensions 100b (shown in phantom in FIG. 4) which extend outwardly and on which are provided a continuation of traces 98. Further, a ground plane (not shown) has been added to the reverse surface and holes 114 have been eliminated.

FEC members 46,46a and 46b are placed on top surface 54 of base 42 with alignment pegs 74 being received in holes 118 for correct registration and orientation. Flaps 100 pass under pressure members 44 and between hinge stubs 86. More specific details are given along with the descriptions of the use of sockets 40,40a and 40b.

Figure 5:
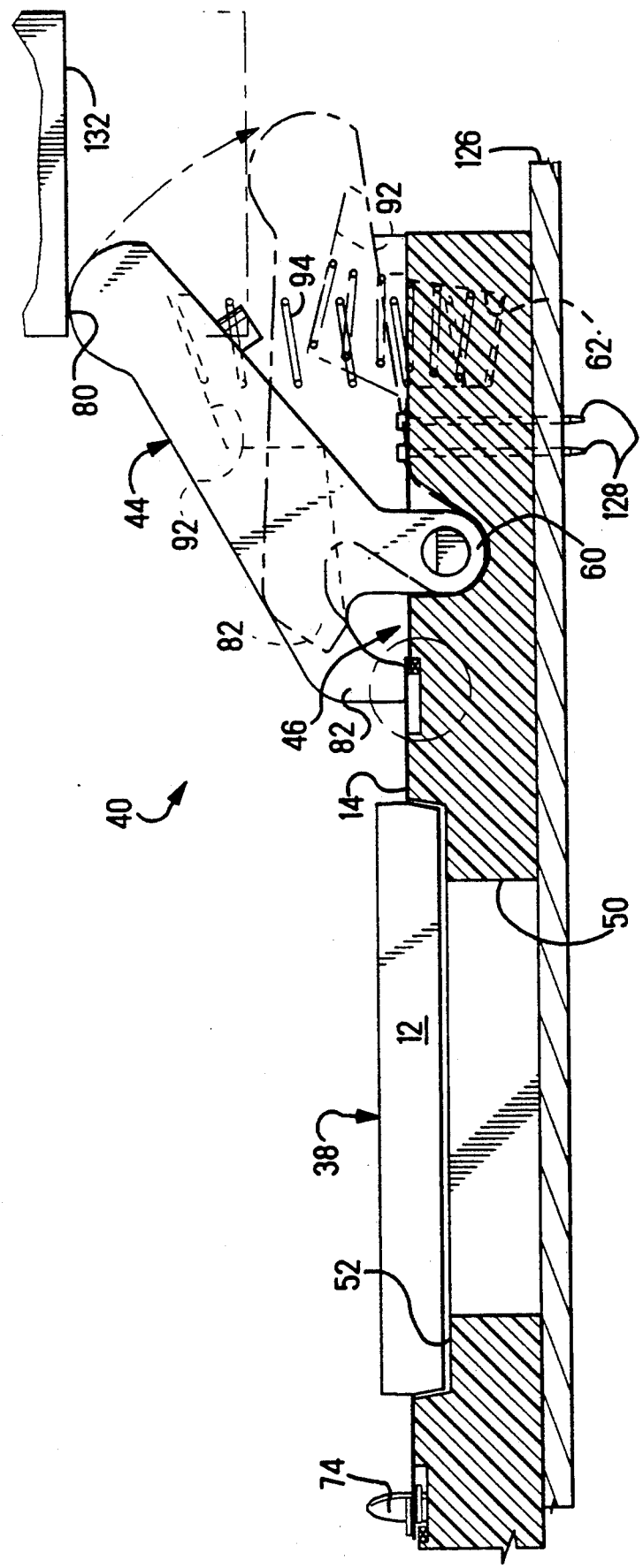
FIG. 5 is a side, sectioned view of the socket.
Figure 6:
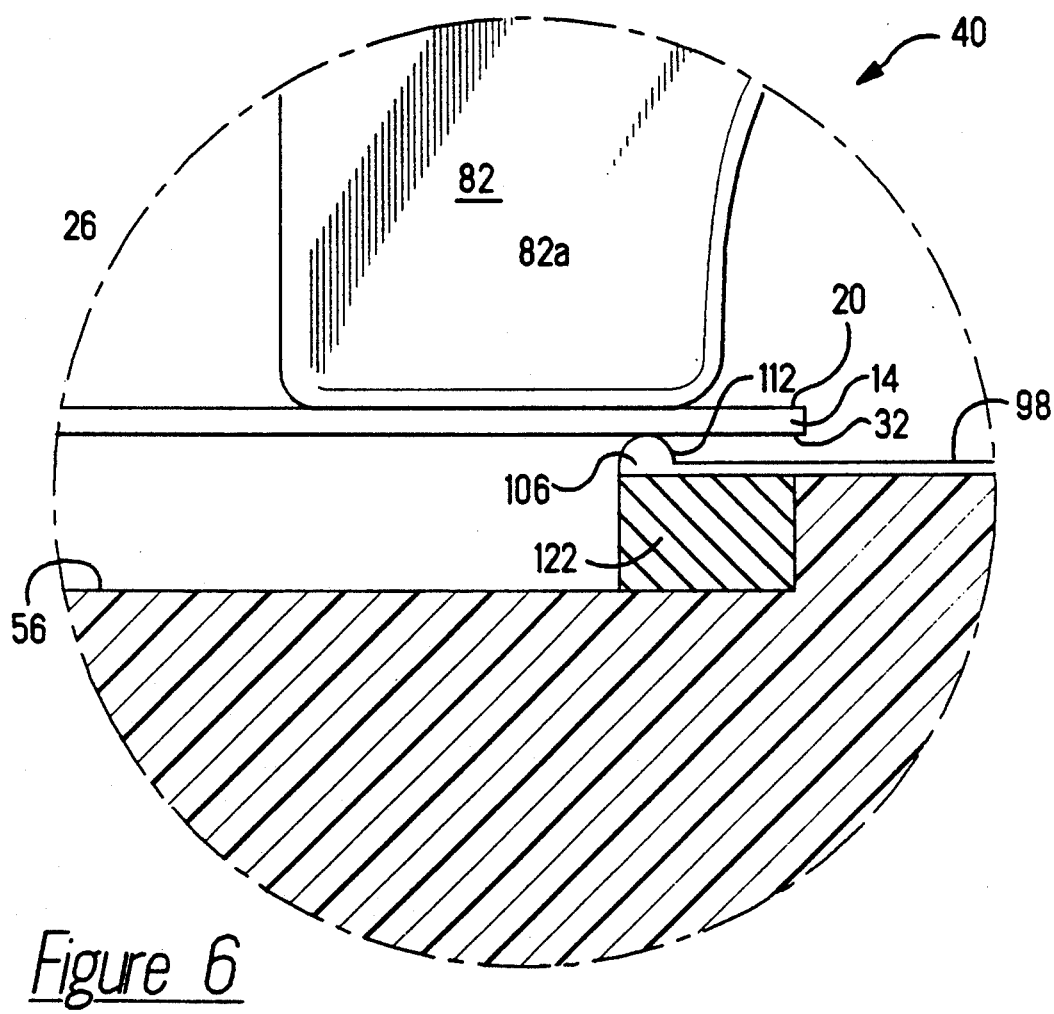
FIG. 6 is an enlarged view or a portion or one socket shown in FIG. 5.

FIGS. 5 and 6 show socket 40 with test device 38 positioned therein. In this case, device 38 will be burnt-in upside down; i.e., as a "dead-bug."

The inner ends 106 and contact pads 112 of traces 98 are supported by elastomer pad 122 in groove 56. The outer ends 108 stop short of grooves 62 and traces 98 are terminated to test board 126 by pins 128 which pass through holes 114.

Package 12 of test device 38 is received in recess 52 and leads 14 extend outwardly to span groove 56. Contact pads 112 electrically engage the ends of leads 14 as shown in FIG. 6.

Test device 38 is placed onto socket 40 with fingers 82 of members 44 being lifted away as shown in FIG. 5. If desired, this can be done by robotic arms 132 pushing down on curved end surfaces 80. Proper registration with contact pads 112 and orientation is provided by pegs 74 being received in holes 34.

Fingers 82 return after the force is removed from surfaces 80 to force leads 14 against contact pads 112. Coil springs 62 provide the required normal forces by pushing against body section 78 near end surfaces 80.

Test device 38 is easily removed, robotically or manually by pushing down on end surfaces 80.

FEC member 46 may be readily replaced with a like member 46 or one having different trace densities and configurations.

Figure 7:
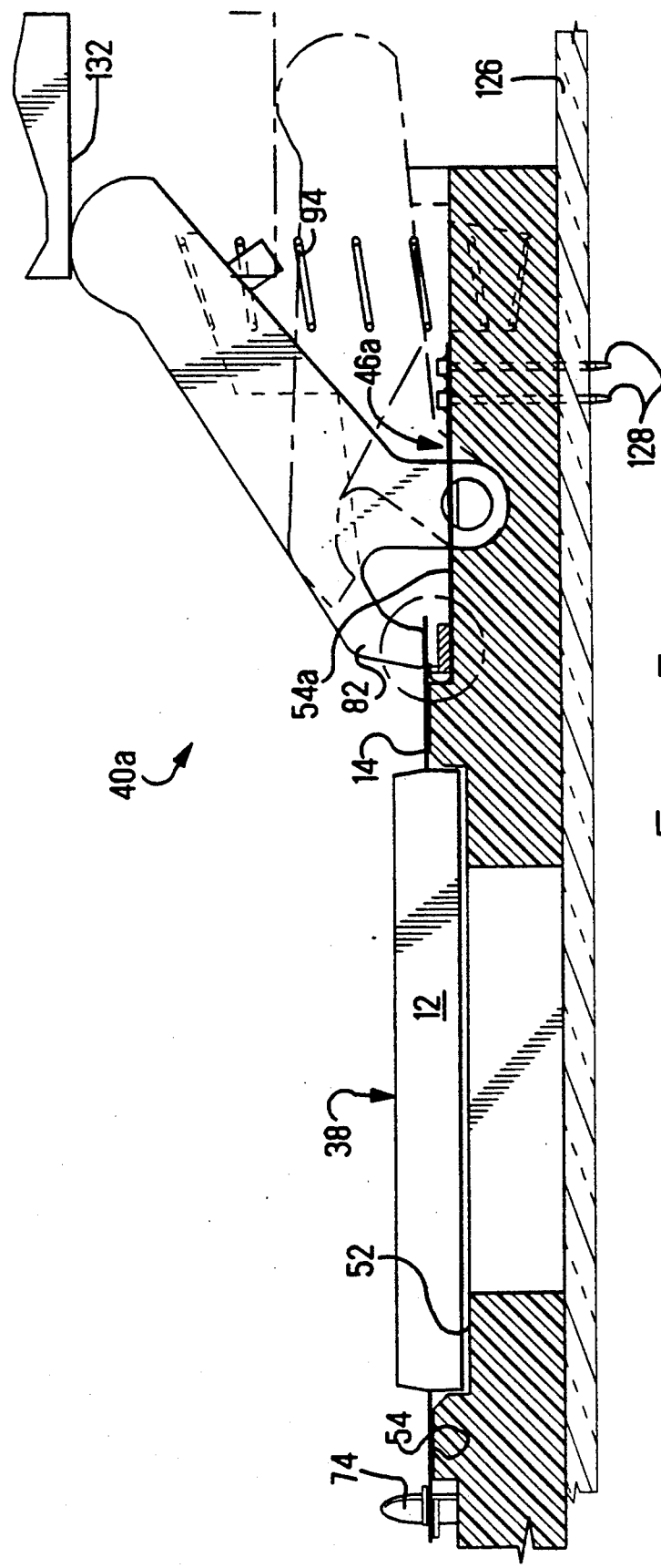
FIG. 7 is a side, sectional view of another embodiment of the socket.
Figure 8:
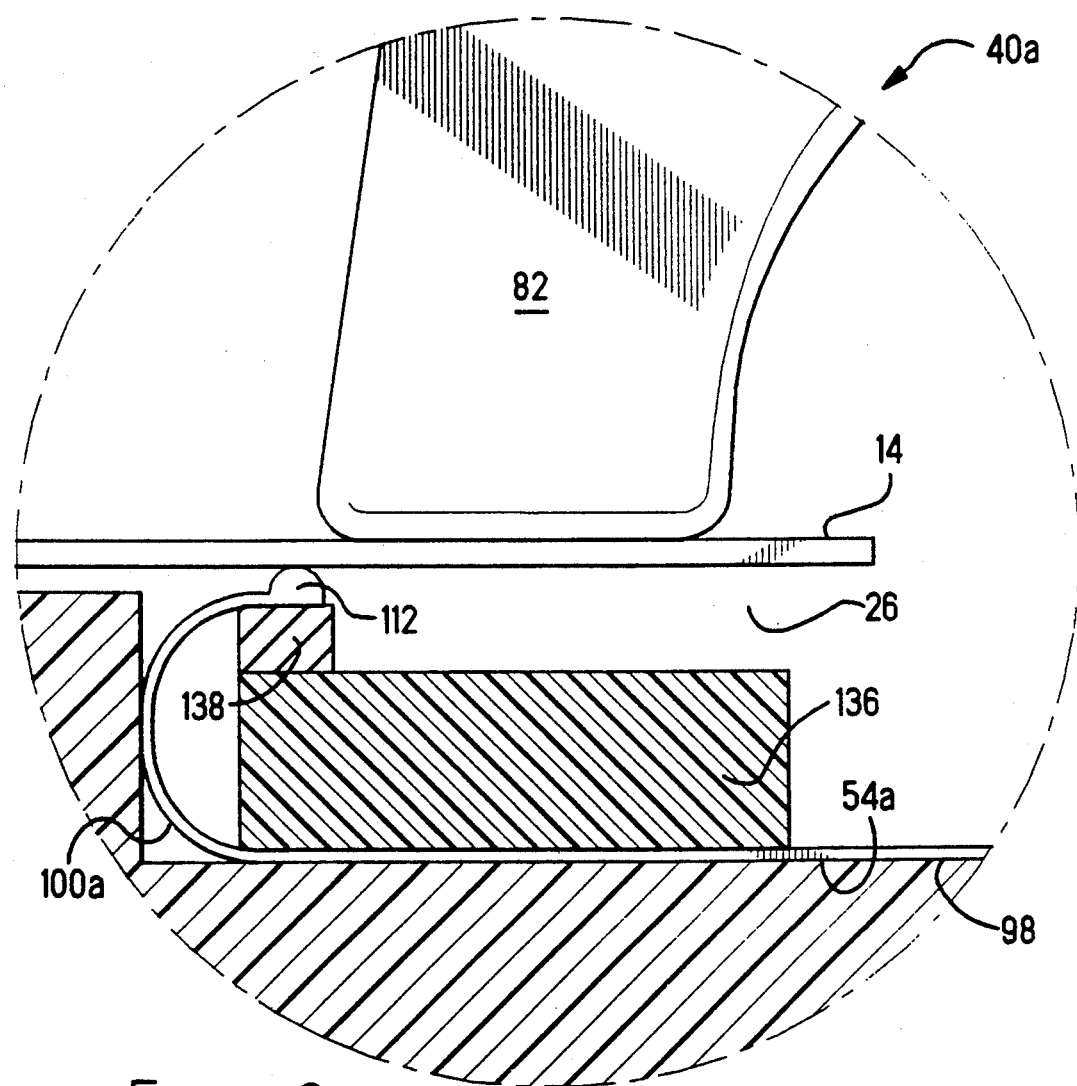
FIG. 8 is an enlarged view of a portion of the socket shown in FIG. 7.

FIGS. 7 and 8 show socket 40a with test device 38 positioned therein right side up as a "live bug" for burn-ing-in.

Socket 40a has been modified by removing base material from groove 56 outwardly to define a lower top surface 54a. Lead-in members 68, keying member 72 and pegs 74 are located on surface 54a.

FEC member 46a is placed on the lower top surface 54a with flap extensions 100a passing under a plastic backing 136 and back up and onto elastomer block 138. Contact pads 112 which are on the reverse side of FEC member 46a now face outwardly as shown in FIG. 8.

Traces 98 are terminated to test board 126 by pins 128.

Alignment and orientation is obtained by cooperation between holes 118, pegs 74 and keying member 72, slot 120.

Test device 38 is placed onto socket 40a (with fingers 82 lifted away) with package 12 in recess 52 and leads 14 projecting over lower top surface 54a. Fingers 82 abut and push down on leads 14 to provide the normal force as described above with respect to socket 40.

FIGS. 9 and 10 show socket 40b with test device 38 positioned therein right side up for performance testing.

Socket 40b is the same as socket 40 except that edges 140 of base 42 have been rounded off and flap outer extensions 100b pass thereover so that traces 98 can be terminated directly to test board 126 either by soldering or through a two-piece connector system (not shown). By eliminating pins 128 and adding a ground plane (not shown) to FEC member 46b, a matched impedance, high speed signal socket is provided. In all other respects, socket 40b and FEC member 46b function as described above with respect to sockets 40 and 40a.

As can be discerned from the foregoing descriptions, a burn-in/test socket for use with a plastic quad flat pack before the gull wing leads are formed has been disclosed. The advantages offered by this socket include vertical actuation compatible to robotic equipment for automatic loading and unloading, extremely flexible to many different PQFP lead centerline spacing by changing out the FEC member and flexible to fan out on the FEC member flaps to accommodate trace routing. Further, the center of the socket is open for cooling and the alignment pegs locate both the film ring and test device accurately, the normal forces to the contact interface is maintained by stainless steel springs and a matched impedance, high speed signal socket can be provided with very little modification. More specifically the socket includes a base for supporting an FEC member and pivoting pressure members. Stainless steel coil springs work against the pressure members to maintain normal forces during hostile burn-in temperatures. Alignment pegs insure accurate registration between the FEC member and test device.

Socket 40 of the present invention was developed for a PQFP 10 having leads 14 extending straight out from the body 12. However, it should be clear that the socket can be used as a production socket. Further, the socket 40 can be used with other types of electronic devices, probably without modification except perhaps for size. Therefore, it is the intent that the following claims are not limited to being a burn-in/test socket or for use with only one type electronic device.

We claim:

1. An electrical socket, comprising:
   a base having a generally central area on which can be mounted an electronic device having electrical leads,
   multiple pressure members arranged along a periphery of said generally central area without covering said generally central area,
   a circuit carrying member having conductive traces extending under said pressure members,
   springs biasing said pressure applying portions toward said traces, whereby the electrical leads can extend under said pressure applying portions are be urged by said pressure applying portions against said traces,
   said pressure applying members being moveable against the bias of said springs to move said pressure applying portions away from said traces, and
   said pressure applying members being attached irremovably to said base, and being attached to said base for movement toward and away from said traces without covering said generally central area.

2. An electrical socket, as recited in claim 1, wherein, said pressure applying members are pivotally attached to said base, and inclined portions of said pressure applying members are inclined away from said generally central area, and are adapted to receive forces to pivot the pressure applying members away from said traces.

3. An electrical socket as recited in claim 1, wherein, said circuit carrying member extends evelyn with a mounting surface of said base for direct connection to a circuit board.

4. An electrical socket as recited in claim 1, and further comprising: an electronic device receiving recess in a top of said base, and an opening from a top to a bottom of said base intersecting said recess.

5. An electrical socket as recited in claim 1, and further comprising: plates, elastomeric pads on said plates, said traces extending from under the plates to cover the pads, and the pads supporting said traces.

6. An electrical socket as recited in claim 1, wherein, pivots pivotally attach said pressure applying members to said base, and said pressure applying members are pivotally biased by said springs, and are moveable pivotally against the bias of said springs.

7. An electrical socket as recited in claim 6, wherein, inclined portions of said pressure applying members are inclined in different respective directions away from said generally central area, and are adapted to receive forces to pivot the pressure applying members away from said traces and against the bias of said springs.

8. An electrical socket, comprising:
a base having a generally central area,
multiple pressure members arranged along a periphery of said generally central area, said pressure applying members being moveable away from said generally central area in respective different directions to receive in said generally central area an electronic device having electrical leads,
a circuit carrying member having conductive traces extending under said pressure members,
said pressure applying portions being moveable toward said traces, whereby said electrical leads can extend under said pressure applying portions and be urged by said pressure applying portions against said traces,
said pressure applying members being moveable away from said traces, and
said pressure applying members being attached irremovably to said base, and being attached to said base for movement toward and away from said traces without covering said generally central area.

9. An electrical socket, as recited in claim 8, wherein, said pressure applying members are pivotally attached to said base, and inclined portions of said pressure applying members are inclined away from said generally central area, and are adapted to receive forces to pivot the pressure applying members away from said traces.

10. An electrical socket as recited in claim 8, wherein, said circuit carrying member extends evenly with a mounting surface of said base for direct connection to a circuit board.

11. An electrical socket as recited in claim 8, and further comprising: an electronic device receiving recess in a top of said base, and an opening from a top to a bottom of said base intersecting said recess.

12. An electrical socket as recited in claim 8, and further comprising: plates elastomeric pads on said plates, said traces extending from under the plates to cover the pads, and the pads supporting said traces.

* * * * *

UNITED STATES PATENT AND TRADEMARK OFFICE
CERTIFICATE OF CORRECTION

PATENT NO. : 5,161,984
DATED : 11/10/92
INVENTOR(S) : Attalee S. Taylor, et al.

It is certified that error appears in the above-identified patent and that said Letters Patent is hereby corrected as shown below:

Claim 3, Column 5, Line 6 - the word "evelyn" should be --evenly--.

Signed and Sealed this

Fifth Day of October, 1993

Attest:

BRUCE LEHMAN

Attesting Officer         Commissioner of Patents and Trademarks